United States Patent
Kubota et al.

(10) Patent No.: US 9,657,384 B2
(45) Date of Patent: May 23, 2017

(54) DLC FILM COATING AND COATED VALVE LIFTER

(71) Applicant: Nittan Valve Co., Ltd., Kanagawa (JP)

(72) Inventors: Yukio Kubota, Kanagawa (JP); Shinichi Ishii, Kanagawa (JP)

(73) Assignee: NITTAN VALVE CO., LTD., Kanagawa (JP)

( * ) Notice: Subject to any disclaimer, the term of this patent is extended or adjusted under 35 U.S.C. 154(b) by 0 days.

(21) Appl. No.: 14/772,030

(22) PCT Filed: Mar. 22, 2013

(86) PCT No.: PCT/JP2013/058244
§ 371 (c)(1),
(2) Date: Sep. 1, 2015

(87) PCT Pub. No.: WO2014/147805
PCT Pub. Date: Sep. 25, 2014

(65) Prior Publication Data
US 2016/0017477 A1   Jan. 21, 2016

(51) Int. Cl.
*C23C 16/26* (2006.01)
*C23C 14/06* (2006.01)
(Continued)

(52) U.S. Cl.
CPC ........ *C23C 14/0611* (2013.01); *C23C 14/024* (2013.01); *C23C 14/025* (2013.01);
(Continued)

(58) Field of Classification Search
USPC .... 428/408, 469, 472, 698; 123/90.51, 90.5, 123/90.6, 188.1
See application file for complete search history.

(56) References Cited

U.S. PATENT DOCUMENTS 5,237,967 A * 8/1993 Willermet ............... F01L 1/143
123/90.51
6,740,393 B1 * 5/2004 Massler ............... C23C 16/029
428/698
(Continued)

FOREIGN PATENT DOCUMENTS

CN    102041473 A    5/2011
JP    2001225412 A    8/2001
(Continued)

OTHER PUBLICATIONS

International Search Report, May 7, 2013, 2 pages, from PCT/JP2013/058244, published as WO 2014/147805 on Sep. 25, 2014.
(Continued)

*Primary Examiner* — Archene Turner
(74) *Attorney, Agent, or Firm* — Fulwider Patton LLP

(57) ABSTRACT

The present invention provides a DLC (diamond like carbon) film coating and a coated valve lifter, wherein the DLC film coating can be formed at a film forming rate comparable with that achieved in the case of forming the DLC coating film by the CVD (chemical vapor deposition) method and has good durability comparable with that obtained in the case of forming the DLC film coating by the sputtering film forming method.

The DLC film coating includes an intermediate layer 3 deposited on the surface of a base substrate and a DLC layer 4 deposited on the intermediate layer 3. The intermediate layer 3 is formed of metal carbide or metal capable of forming a hard surface and the DLC layer 4 is formed by adding a common metal element to that contained in the intermediate layer 3 thereto while inert gas containing hydrocarbon gas is being introduced. As a result, the intermediate layer 3 and the DLC layer 4 can be formed by sequential sputtering processing and in addition, an H (hy- (Continued)

drogen) content contained in the DLC layer 4 can be adjusted by forming a Me-DLC (metal addition DLC) layer as a DLC layer 4.

4 Claims, 3 Drawing Sheets

(51) Int. Cl.
    *C23C 16/02* (2006.01)
    *C23C 14/02* (2006.01)
    *F01L 3/04* (2006.01)

(52) U.S. Cl.
    CPC ...... *C23C 16/0272* (2013.01); *C23C 16/0281* (2013.01); *C23C 16/26* (2013.01); *F01L 3/04* (2013.01)

(56) References Cited

U.S. PATENT DOCUMENTS

| | | | |
|---|---|---|---|
| 7,160,616 B2 * | 1/2007 | Massler | C23C 16/029 |
| | | | 428/336 |
| 7,498,083 B2 | 3/2009 | Yamamoto et al. | |
| 7,887,919 B2 * | 2/2011 | Yamamoto | C23C 14/022 |
| | | | 428/408 |
| 2005/0098134 A1 * | 5/2005 | Nishimura | C23C 14/0605 |
| | | | 123/90.51 |
| 2007/0059529 A1 * | 3/2007 | Hosenfeldt | C23C 14/0605 |
| | | | 428/408 |
| 2010/0012064 A1 * | 1/2010 | Lyo | F01L 1/143 |
| | | | 123/90.48 |
| 2012/0205875 A1 * | 8/2012 | Kennedy | C23C 16/0281 |
| | | | 277/442 |

FOREIGN PATENT DOCUMENTS

| | | |
|---|---|---|
| JP | 2004010923 A | 1/2004 |
| JP | 2006214314 A | 8/2006 |
| JP | 4320605 B | 6/2009 |
| JP | 2010112341 A | 5/2010 |
| JP | 2012208073 A | 10/2012 |
| WO | 2012/156647 | * 11/2012 |

OTHER PUBLICATIONS

Supplementary European Search Report, Jan. 2, 2017, 7 pages, from PCT/JP2013058244, published as WO2014/147805 on Sep. 25, 2014.

China Office Action, Jan. 4, 2017, 6 pages, from CN201380074991. 1.

* cited by examiner

US 9,657,384 B2

DLC FILM COATING AND COATED VALVE LIFTER

CROSS-REFERENCES TO RELATED APPLICATIONS

This application is a national stage application based on International Application No. PCT/JP2013/058244 filed Mar. 22, 2013.

FIELD OF THE INVENTION

The present invention relates to a DLC (diamond-like carbon) film coating formed on a sliding surface of an engine component or the like and a coated valve lifter.

BACKGROUND ART OF THE INVENTION

A film coating of DLC formed on a sliding surface of component parts of an engine or the like is normally formed using a CVD (chemical vapor deposition) film forming method because the surface smoothness as well as the deposition rate are higher in the CVD film forming method than those in the sputtering deposition method using PVD (physical vapor deposition method) which requires long a deposition time period, thereby enabling mass production and lowering manufacturing cost of the DLC coating layer.

Further, like a DLC film coating on a sliding component disclosed in a Patent Publication No. 1, metal such as Cr (chromium), Mo (molybdenum) and or like are added to DLC to form an Me-DLC layer (metal added DLC) which has low friction properties.

PRIOR PUBLICATIONS

Patent Publication

Patent Publication No. 1: Japanese Patent No. 4320605

DISCLOSURE OF THE INVENTION

Problems to be Solved by the Invention

However, since the DLC layer formed by the CVD film forming process contains a high concentration of H (hydrogen) correspondingly to a high deposition rate thereof, the DLC layer is relatively soft. Thus, even if a Me-DLC layer is used as the DLC layer, the durability of the Me-DLC layer is inevitably lower than that of the DLC layer formed by the sputtering deposition method.

The object of the present invention is to provide a DLC film coating which can be formed at a high deposition rate comparable to that of the CVD deposition method and has high durability comparable to that formed by the sputtering deposition method, and a coated valve lifter.

Means for Solving Problems

An invention defined in Claim 1 is directed to a DLC film coating comprising an intermediate layer deposited on a base substrate of a mechanical element constituting an internal combustion engine and a DLC (diamond-like carbon) layer deposited on the intermediate layer, wherein the intermediate layer is formed by sputtering processing of metal carbide or metal capable of forming a hard surface and the DLC layer is formed by sputtering precessing of carbon under such circumstances where inert gas containing hydrocarbon gas is being introduced and continuing the sputtering processing of the intermediate layer to add a common metal element to that contained in the intermediate layer thereto until completing the formation of the DLC layer, while an amount of the metal element to be added the DLC layer is gradually reduced as the thickness of the DLC layer formed on the intermediate layer becomes thicker.

An invention defined in Claim 3 is directed to the DLC film coating in accordance with Claim 1, wherein W (tungsten) is selected as the common metal element.

An invention defined in Claim 5 is directed to the DLC film coating in accordance with Claim 3, wherein the DLC layer is formed by controlling the amount of the metal element to be added thereto within 0.5 to 20 at % (atomic percent) on the surface thereof.

An invention defined in Claim 6 is directed to the DLC film coating in accordance with Claim 3 or 5, wherein the DLC layer is formed by controlling an H content contained therein within 8 to 30 at %.

An invention defined in Claim 8 is directed to the DLC film coating in accordance with any one of Claims 1, 3, 5 and 6, wherein the mechanical element is specified as a valve train mechanical element.

An invention defined in Claim 9 is directed to the DLC film coating in accordance with Claim 8, wherein the mechanical element is specified as a valve train mechanical element.

Technical Effects of the Invention

According to the invention defined in Claim 1, in the mechanical element constituting the internal combustion engine, since the intermediate layer is formed of metal carbide or metal, the high adhesiveness of the DLC layer on the side of a coating surface with respect to the base substrate can be ensured and since an added metal to the DLC layer is selected so as to be common to that constituting the intermediate layer, the film forming process of the intermediate layer can be continuously transferred to the film forming process of the DLC layer by controlling the sputtering processing to be continued.

In the film forming process of the DLC layer, the H content in the DLC layer can be adjusted by performing carbon sputtering processing under circumstances where inert gas containing a predetermined amount of hydrocarbon gas is being introduced, thereby enabling high hardness of the DLC layer, while a high sputtering ratio can be ensured. At that time, the metal element is added by controlling the amount thereof to be gradually reduced until completing the formation of the DLC layer, whereby the intermediate layer and the DLC layer can be integrally formed so that the amount of the metal element is continuously changed from the intermediate layer to the surface of the DLC layer.

Therefore, the film forming process of the DLC layer can be smoothly transferred from the film forming process of the intermediate layer and the good sputtering ratio can be endured without any risk that the inside of a furnace is contaminated by continuously controlling the sputtering processing so as to be transferred from that for forming the intermediate layer to that for forming the DLC layer, thereby ensuring a high film forming speed to decrease the film forming cost. Further, even when an impulsive surface loading such as a surface pressure fluctuation is applied, the surface delamination can be prevented by increasing adhesiveness between the base substrate and the DLC layer by providing the intermediate layer therebetween, integrally forming the intermediate layer and the DLC layer so that the amount of added metal is continuously changed until completing the formation of the DLC layer and controlling the hardness of the DLC layer, whereby the high resistance to impact can be ensured. Furthermore, since metal is added to the DLC layer until the surface of the DLC layer has been formed, the abrasion of the DLC layer due to a specified engine oil added material such as molybdenum can be prevented to protect the sliding surface. Therefore, the durability of the DLC film coating can be ensured so as to be accommodated to the operating environment unique to the internal combustion engine while the mechanical loss of the mechanical element is suppressed.

According to the invention defined in Claim 3, in addition to the technical effects obtained by the invention defined in Claim 1, since W is selected as the common metal element and the intermediate layer can be formed of WC (tungsten carbide) which is well known to be stable and have a good adhesiveness, the reliability of the DLC layer can be ensured.

According to the invention defined in Claim 5, in addition to the technical effects obtained by the invention defined in Claim 3, since the additive amount of W is controlled within 0.5 to 20 at % at the surface of the DLC layer, the friction of the DLC layer is lower than that of a DLC layer formed only by the sputtering processing, thereby further improving the durability of the DLC film coating.

According to the invention defined in Claim 6, in addition to the technical effects obtained by the invention defined in any one of Claim 3 to 5, since the H content contained in the DLC layer is determined within 8 to 30 at %, the DLC film coating having necessary durability and considerable low friction sliding property can be formed and the film forming speed of the DLC coating film can be improved, thereby enabling mass production of the DLC film coating and lowering the manufacturing cost of the DLC film coating.

According to the invention defined in Claim 8, in addition to the technical effects obtained by the invention defined in any one of Claims 1, 3, 5 and 6, even under such a severe circumstance where the DLC film coating is subjected to a high temperature to which the valve train mechanical element are exposed and a continuous high speed and strong oscillation, it is possible simultaneously to reduce the sliding friction of the DLC film coating and ensure the high durability thereof without increase in the film forming cost of the DLC film coating, thereby lowering the mechanical loss of the valve train.

According to the invention defined in Claim 9, in addition to the technical effects obtained by the invention defined in Claim 8, even under such a severe circumstance where the valve lifter is subjected to oil deterioration due to high temperature and large load inputs due to high speed oscillatory and impulsive pressure continuously impinging on a cam contact portion, it is possible to suppress the abrasion of the valve lifter on the exhaust side caused by additives such as molybdenum to be added to oil and ensure good durability thereof.

PREFERRED EMBODIMENT OF THE INVENTION

A preferred embodiment concretely configured based on the above described technical idea will be described below referring to accompanying drawings.
(Configuration)

Figure 1:
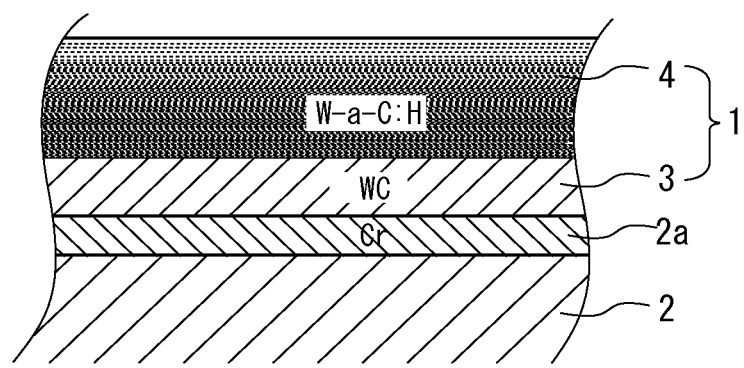
FIG. 1 is a cross sectional view showing the layered structure of a DLC film coating.

As shown in FIG. 1 which is a cross sectional view showing the layer structure of a coating layer, a DLC film coating 1 according to the present invention is constituted by a ground layer 2a coated on a base substrate 2, an intermediate layer 3 deposited on the ground layer 2a and a DLC layer 4 deposited on the intermediate layer 3. The intermediate layer 3 is formed of metal carbide or metal capable of forming a hard surface and subsequently to the formation of the intermediate layer 3, the DLC layer 4 containing a common metal element to that contained in the intermediate layer 3 is formed while an amount of hydrogen to be contained in the DLC layer is being controlled by introducing inert gas containing hydrocarbon gas.

In the thus configured DLC film coating 1, since the intermediate layer 3 and the DLC layer 4 can be formed by the successive sputtering processing and the H content in the DLC layer 4 can be controlled within a predetermined range, it is possible to form the DLC layer 4 having a good durability due to the film formation by the sputtering deposition method and the high deposition rate and good surface smoothness comparable to those substantialized by using the CVD film forming method. In particular, since W is selected as a common metal element to be added to the intermediate layer 3 and the DLC layer, good and stable adhesion properties between the DLC layer 4 and the intermediate layer 3 can be ensured.

Therefore, in the case where the DLC film coating 1 is applied to a cam contact surface of a valve lifter, not only sliding friction of the cam contact surface can be reduced but also the high durability of the cam contact surface can be ensured. Thus, although among engine component parts, the DLC coating film is subjected to a particularly severe circumstance where the cam slides thereon, mechanical loss of the valve train can be reduced and the deposition speed can be increased, thereby enabling mass production and lowering the manufacturing cost of the DLC film coating 1.

The DLC film coating will be illustrated in detail with a specific embodiment. Materials used for the base substrate 2 can be selected widely from general carbon steel and alloyed steel which are used for mechanical components including engine component parts. The ground layer 2a is formed by coating the surface of the base substrate 2 with Cr to adjust the surface of the base substrate 2 so as to be suitable for forming the intermediate layer 3 and the DLC layer 4 thereon. As the intermediate layer 3, a WC (tungsten carbide) layer is formed on the ground layer 2a so that the total thickness of the ground layer 2a and the intermediate layer 3 is equal to or thicker than 0.5 µm, thereby ensuring good adhesiveness between the intermediate layer 3 and the DCL layer 4. The DLC layer 4 is formed as a Me-DLC layer added with W.
(Film Forming Process)

Figure 2:
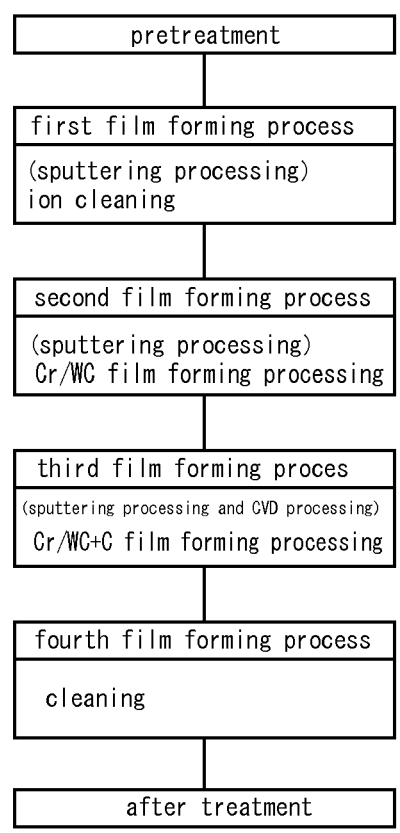
FIG. 2 is a diagram showing a process chart for forming a DLC film coating.

As shown in FIG. 2 indicating a process chart for forming the above described DLC film coating 1, the film forming process includes a pretreatment including an ultrasonic cleaning of a processing object such as the valve lifter and the like and an after treatment of corrosion protection treatment of the processing object such as the valve lifter and the like. Between the pretreatment and after treatment of the processing object such as the valve lifter and the like, the first film forming process of ion cleaning, the second film forming process of Cr/WC film forming processing, the third film forming process of Cr/WC and C film forming processing and the fourth film forming process of cooling are successively carried out on the sliding surface of the base substrate as the processing object. These firm forming processing is carried out using a film forming apparatus which is provided with a C target made of carbon and a WC target made of tungsten carbide and into which inert gas containing hydrocarbon gas can be introduced.

In the first process of the ion cleaning, the surface of the base substrate is subjected to Ar (argon) ion cleaning by the sputtering processing at 200° C. under the vacuum condition and in the second process of Cr/WC film forming processing following the first process, the ground layer 2a is formed of Cr and the intermediate layer 3 is formed of WC. Subsequently, and in the third process of Cr/WC and C film forming processing, the sputtering processing is conducted while the amount of W to be added is being gradually reduced and simultaneously, inert gas containing hydrocarbon gas is introduced by the CVD processing, thereby forming the DLC layer 4 of W-DLC (diamond-like carbon added with tungsten).

Through the series of four film forming processing, the adhesiveness between the DLC layer 4 and the base substrate 2 can be increased by forming the ground layer 2a of Cr and the intermediate layer 3 of WC to improve peeling strength. Further, even after the WC intermediate layer 3 was formed, it is possible to continue the sputtering processing of the WC target and apply electrical current to the C target by simultaneously conducting the sputtering processing and CVD processing, thereby enabling to continue the sputtering processing without changing the film forming process and the intermediate layer 3 formed of WC can be continuously gradually changed to the Me-DLC layer added with W. At the same time, the hydrocarbon gas is introduced to ionize the metal element, thereby promoting the formation of the DLC layer and the H content contained in the W added Me-DLC layer 4 can controlled within a predetermined range to decrease the abrasion loss of the DLC layer 4.

Further, in the above described film forming process, the DLC layer 4 is formed by gradually decreasing the additive amount of W in accordance with the change of the thickness of the DLC layer 4 deposited on the intermediate layer 3 and since the amount of metal added to the DLC layer 4 is continuously decreased, the friction characteristics of the surface of the DLC layer 4 can be improved while good resistance characteristics to the generation of cracks in the DLC coating film and the like can be ensured.

(Sliding Characteristics)

The sliding characteristics of the above described DLC film coating 1 can be estimated based on the friction coefficient test as follows. This friction coefficient test is a unit estimation based on the pin-on-disc test and it is possible to correlate with a motoring test by adjusting surface pressure and the speed of a sliding surface.

Figure 3:
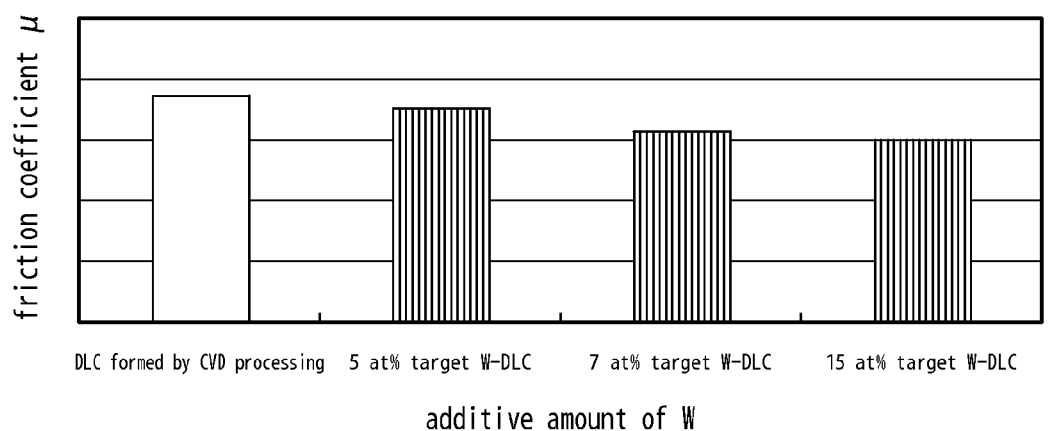
FIG. 3 is a graph showing a relationship between a friction coefficient of a DLC layer and an amount of W added to the DLC layer.

In connection with the sliding characteristics of the DLC layer 4, as shown in FIG. 3 indicating the relationship between the additive amount of W and the friction coefficient, in the case where the friction coefficient of the DLC layer added with no W and formed by the CVD method is used as a standard frictional coefficient, it is recognized that the friction coefficient of the DLC layer is lowered as the additive amount at % of W is increased. Someone considers these results so that a complex of W and an oil additives is synthesized and adhered to the surface of the DLC layer 4, thereby decreasing the friction coefficient of the DLC layer 4. When the additive amount of W becomes equal to or larger than 15 at %, the abrasion resistance characteristics becomes lower. Therefore, all range where the abrasion resistance characteristics of the DLC layer is comparable to that of the DLC layer added with no W and formed by the CVD method can be covered by specifying the amount of W to be added to the DLC layer 4 within 0.5 to 20 at %.

(Abrasion Resistance Characteristics)

Based on the test results of the abrasion loss, the durability of the above configured DLC coating film 1 can be estimated as follows. This abrasion loss test is a motoring test for estimating a functioning durability of the valve train and according to this abrasion test, it is possible to estimate the abrasion loss of a cylinder head in the case where a cam shaft is driven by a motor. Therefore, the abrasion loss can be estimated in the state similar to an actual machine.

Figure 4:
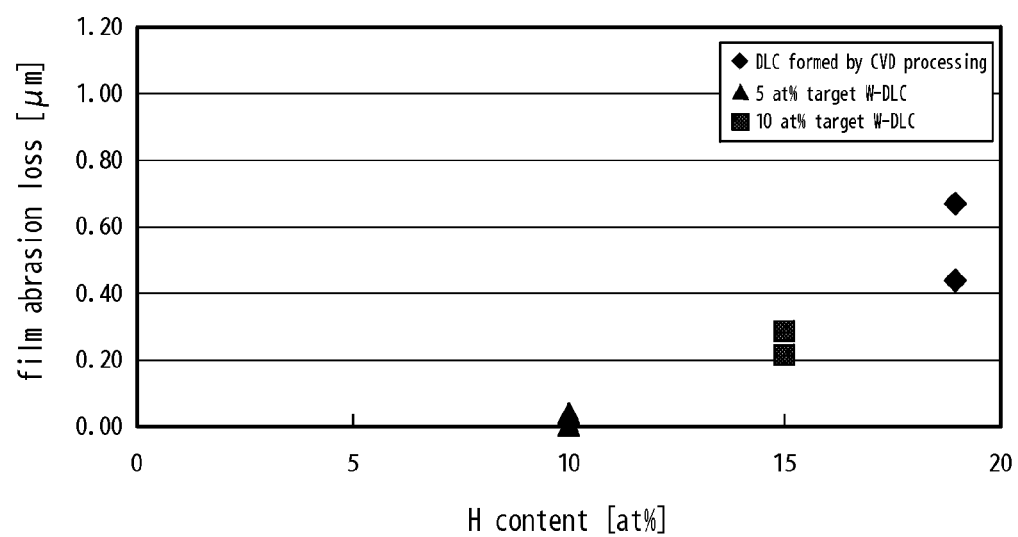
FIG. 4 is a graph showing a relationship between abrasion loss and an amount of H contained in a DLC layer depending upon an amount of W added to a DLC layer.

In connection with the abrasion loss resistance characteristics of the DLC layer 4, as shown in FIG. 4 indicating a relationship between abrasion loss and an amount of H contained in a DLC layer 4 depending upon an amount of W added to a DLC layer 4, it has been found that in the case where the additive amount of W is relatively small, that is, the additive amount of W is 5 at % target W-DLC, the abrasion loss is small. It can be considered that when the additive amount of W is increased more than necessary, the DLC layer becomes soft and the abrasion loss is promoted.

Concerning the abrasion loss resistance characteristics, when the H content increases, the abrasion loss increases. The H content contained in the DLC layer 4 formed by the normal sputtering film forming method is 5 to 15 at % and in connection with the above configured DLC coating film, if the CVD film forming method capable of injecting more hydrocarbon gas is used in conjunction with the sputtering film forming method, the H content can be increased to the level of that contained in the DLC layer formed by the CVD film forming method and the film forming speed of the sputtering film forming method can be increased. Therefore, all range of the H content in contained in the DLC layer 4 formed by the CVD film forming method, which is equal to or larger than 15 at % and normally equal to about 20 at %, can be covered by specifying the H content contained in the DLC layer 4 within 8 to 30 at %.

In the case where the above described DLC coating film 1 is applied to a cam contact portion of a valve lifter, even if the valve lifter is subjected to a severe environment such as oil deterioration, large input load or the like, the sliding friction of the cam contact portion can be reduced and the good durability thereof can be simultaneously ensured without increase in a film forming cost of the DLC coating film 1, thereby reducing the mechanical loss of the valve train.

EXPLANATION OF REFERENCE NUMERALS 1 a DLC coating film
2 a base substrate
2a a ground layer
3 an intermediate layer
4 a DLC layer

The invention claimed is:
1. A DLC film coating consisting of:
a ground layer comprising Cr (chromium) and arranged on a surface of a base substrate of a valve train mechanical element constituting an internal combustion engine;
an intermediate layer arranged on the ground layer and comprising W (tungsten) or WC (tungsten carbide);
a DLC layer arranged on the intermediate layer and comprising DLC (diamond like carbon) and W; and
wherein in the DLC layer, an amount of the tungsten is gradually reduced from a side of the intermediate layer toward an exposed surface thereof, and an amount of the tungsten at the exposed surface of the DLC layer is 0.5 to 20 at % (atomic percent).

2. A DLC film coating in accordance with claim 1, wherein an H content contained in the DLC layer is within 8 to 30 at %.

3. A DLC film coating in accordance with claim 1, wherein the valve train mechanical element is specified as a valve train mechanical element.

4. A DLC film coating in accordance with claim 1, wherein the valve train mechanical element is specified as a valve lifter.

* * * * *